United States Patent
Fukushi

(10) Patent No.: US 10,283,387 B2
(45) Date of Patent: May 7, 2019

(54) PEELING APPARATUS

(71) Applicant: DISCO CORPORATION, Tokyo (JP)

(72) Inventor: Nobuyuki Fukushi, Tokyo (JP)

(73) Assignee: Disco Corporation, Tokyo (JP)

( * ) Notice: Subject to any disclaimer, the term of this patent is extended or adjusted under 35 U.S.C. 154(b) by 48 days.

(21) Appl. No.: 15/617,230

(22) Filed: Jun. 8, 2017

(65) Prior Publication Data

US 2017/0358468 A1    Dec. 14, 2017

(30) Foreign Application Priority Data

Jun. 14, 2016   (JP) ................................. 2016-117843

(51) Int. Cl.

| | |
|---|---|
| B32B 43/00 | (2006.01) |
| H01L 21/67 | (2006.01) |
| B32B 38/10 | (2006.01) |
| G06T 7/00 | (2017.01) |
| H04N 7/18 | (2006.01) |
| H01L 21/683 | (2006.01) |

(52) U.S. Cl.
CPC ........ *H01L 21/67132* (2013.01); *B32B 38/10* (2013.01); *B32B 43/006* (2013.01); *G06T 7/0008* (2013.01); *H01L 21/6715* (2013.01); *H01L 21/67115* (2013.01); *H01L 21/67288* (2013.01); *H01L 21/6838* (2013.01); *H04N 7/183* (2013.01); *G06T 2207/30148* (2013.01); *Y10T 156/1168* (2015.01); *Y10T 156/1978* (2015.01)

(58) Field of Classification Search
CPC . B32B 38/10; B32B 43/006; Y10T 156/1168; Y10T 156/1978

USPC ................................. 156/714, 764, 931, 941
See application file for complete search history.

(56) References Cited

U.S. PATENT DOCUMENTS

| | | | | |
|---|---|---|---|---|
| 7,713,368 B2 * | 5/2010 | Yoshioka | .......... | H01L 21/67132 156/247 |
| 7,740,735 B2 * | 6/2010 | Kerdiles | ................ | G01N 19/04 156/707 |
| 7,798,195 B2 * | 9/2010 | Kobayashi | ........ | H01L 21/67132 156/65 |

(Continued)

FOREIGN PATENT DOCUMENTS

JP    2013-168488    8/2013

*Primary Examiner* — Philip C Tucker
*Assistant Examiner* — Nickolas R Harm
(74) *Attorney, Agent, or Firm* — Greer Burns & Crain, Ltd.

(57) ABSTRACT

A peeling apparatus peels a protective member off a wafer, the protective member including a resin and a film which is fixed to one surface of the wafer with the resin interposed therebetween. The film has a protrusive marginal side extending radially outwardly beyond an outer circumferential edge of the wafer. A holding unit holds another surface of the wafer with the protective member disposed therebelow. A gripping unit grips the protrusive marginal side of the protective member. A peeling mechanism peels the protective member off the wafer by relatively moving the gripping unit and the holding unit radially inwardly from the outer circumferential edge of the wafer toward the center of the wafer. A camera then captures an image of the wafer, and a decision unit determines whether residue of the resin remains on the wafer from the image captured by the camera.

1 Claim, 6 Drawing Sheets

(56) References Cited

U.S. PATENT DOCUMENTS

| | | | | |
|---|---|---|---|---|
| 8,092,645 B2* | 1/2012 | Yip | ............... | H01L 21/67132 |
| | | | | 156/707 |
| 8,360,129 B2* | 1/2013 | Ebata | ................ | B65H 41/00 |
| | | | | 156/714 |
| 8,997,821 B2* | 4/2015 | Hirakawa | ............ | B32B 43/006 |
| | | | | 156/701 |
| 2008/0302480 A1* | 12/2008 | Berger | ............... | B29C 63/0013 |
| | | | | 156/714 |
| 2009/0014124 A1* | 1/2009 | Tsujimoto | ......... | H01L 21/67132 |
| | | | | 156/714 |
| 2014/0076501 A1* | 3/2014 | Kim | ................. | B32B 43/006 |
| | | | | 156/760 |
| 2014/0332166 A1* | 11/2014 | Honda | ............. | H01L 21/67092 |
| | | | | 156/708 |
| 2015/0101758 A1* | 4/2015 | Honda | ............... | B32B 38/10 |
| | | | | 156/714 |

* cited by examiner

PEELING APPARATUS

BACKGROUND OF THE INVENTION

Field of the Invention

The present invention relates to a peeling apparatus for peeling a protective member off a wafer.

Description of the Related Art

For fabricating wafers having flat surfaces in the process of manufacturing semiconductor wafers, it has been customary, for example, to cut a cylindrical ingot made of a raw material such as silicon or the like into thin disk-shaped wafers with a wire saw or the like. Since there are often undulations on both surfaces of such a disk-shaped wafer, the wafer cut out of the ingot is ground to a flat finish, i.e., rotating grinding stones are held against the surfaces of the wafer that have been severed by the wire saw to remove the undulations from the wafer surfaces, thereby planarizing them.

The grinding process will be described in detail below. As shown in FIG. 6 of the accompanying drawings, a protective member is formed from a liquid resin S1 on a surface Wa of a disk-shaped wafer W. Specifically, a disk-shaped film S2 that is larger in diameter than the wafer W is placed on a flat holding surface 90a of a holding table 90 of a protective member forming apparatus. Then, a predetermined amount of liquid resin S1 is supplied from a resin supply source 91 onto the film S2. The resin S1 is curable by light, typically an ultraviolet radiation. While the other surface Wb of the wafer W is being held under suction by holding means 92, the wafer W is pressed downwardly against the liquid resin S1 on the film S2 that is disposed in facing relation to the surface Wa of the wafer W, spreading the liquid resin S1 all over the surface Wa of the wafer W thereby to cover the entire surface Wa with the liquid resin S1. Then, the liquid resin S1 is cured by an ultraviolet radiation emitted from an ultraviolet radiation applying mechanism 93 disposed in the holding table 90, for example, forming a protective member S on the surface Wa of the wafer W as shown in FIG. 7 of the accompanying drawings. The film S2 includes a protrusive marginal side S2a extending radially outwardly beyond an outer circumferential edge Wd of the wafer W.

As shown in FIG. 7, the wafer W is placed on the holding surface of a chuck table 940 of a grinding apparatus 94 such that the surface Wb of the wafer W which is free of the protective member S faces upwardly. Then, a grinding wheel 941 which is rotating about its own axis is lowered from above the wafer W, bringing grinding stones 941a into the surface Wb of the wafer W and grinding the surface Wb of the wafer W to a flat finish. Thereafter, the protective member S is peeled off the surface Wa of the wafer W by a peeling apparatus (for details, see, for example, Japanese unexamined patent application publication No. 2013-168488). The surface Wa of the wafer W which was protected by the protective member S is then ground to a flat finish. The wafer W now has its both surfaces planarized.

SUMMARY OF THE INVENTION

To peel the protective member S off the wafer W, the surface Wb of the wafer W which has initially been ground is held under suction by holding means, and the wafer W is lifted. The film S2 is then gripped by gripping means which includes a clamp or the like, for example, and the gripping means is moved to peel the protective member S off the wafer W. At this time, however, residues of the resin S1 from the protective member S may remain on the surface Wa of the wafer W from which the protective member S has been peeled off. Such residues of the resin S1 may be caused by air bubbles included in the liquid resin S1 or a failure of the liquid resin S1 to be fully cured by the applied ultraviolet radiation at the time the liquid resin S1 is formed into the protective member S.

It is an object of the present invention to provide a peeling apparatus which is capable of confirming whether residues of a resin of a protective member remain on a wafer or not at the time the protective member is peeled off the wafer.

In accordance with an aspect of the present invention, there is provided a peeling apparatus for peeling a protective member off a wafer, the protective member including a resin and a film which is fixed to one surface of the wafer with the resin interposed therebetween, the film having a protrusive marginal side extending radially outwardly beyond an outer circumferential edge of the wafer, including holding means having a holding surface for holding another surface of the wafer thereon with the protective member disposed therebelow, gripping means for gripping the protrusive marginal side of the protective member on the wafer held by the holding means, peeling means for peeling the protective member off the wafer by relatively moving the gripping means and the holding means radially inwardly from the outer circumferential edge of the wafer toward the center of the wafer, imaging means for capturing an image of the one surface of the wafer on which the protective member was formed after the protective member has been peeled off the wafer by the peeling means, and decision means for determining whether residues of the resin remains on the wafer or not from the image captured by the imaging means.

After the peeling means has peeled the protective member off the wafer by relatively moving the gripping means and the holding means radially inwardly from the outer circumferential edge of the wafer toward the center of the wafer, the imaging means captures an image of the one surface of the wafer on which the protective member was formed, and the decision means determines whether residues of the resin remains on the wafer or not from the image captured by the imaging means.

The above and other objects, features and advantages of the present invention and the manner of realizing them will become more apparent, and the invention itself will best be understood from a study of the following description and an appended claim with reference to the attached drawings showing a preferred embodiment of the invention.

DETAILED DESCRIPTION OF THE PREFERRED EMBODIMENT

Figure 1:
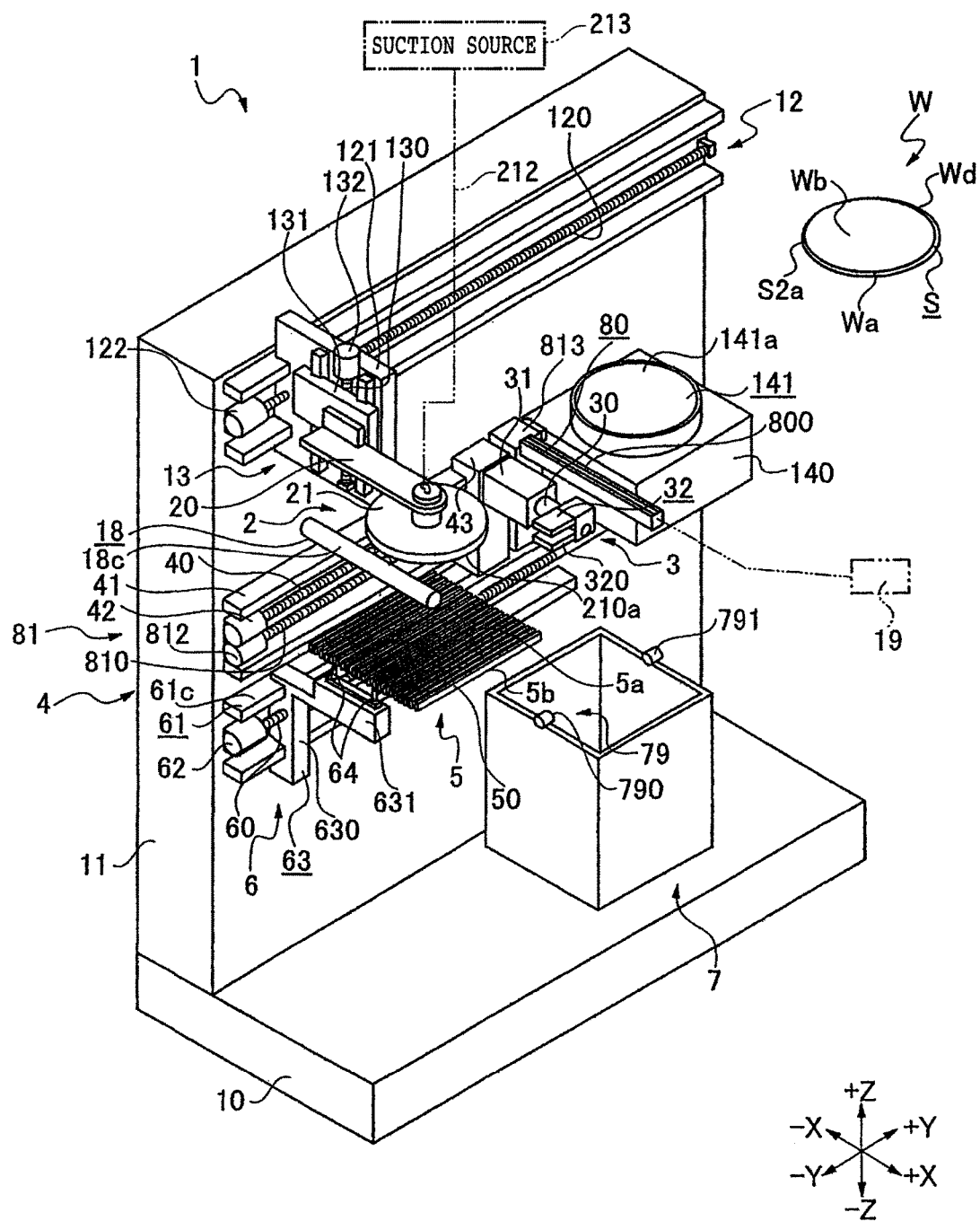
FIG. 1 is a perspective view of a peeling apparatus according to an embodiment of the present invention.
Figure 2:
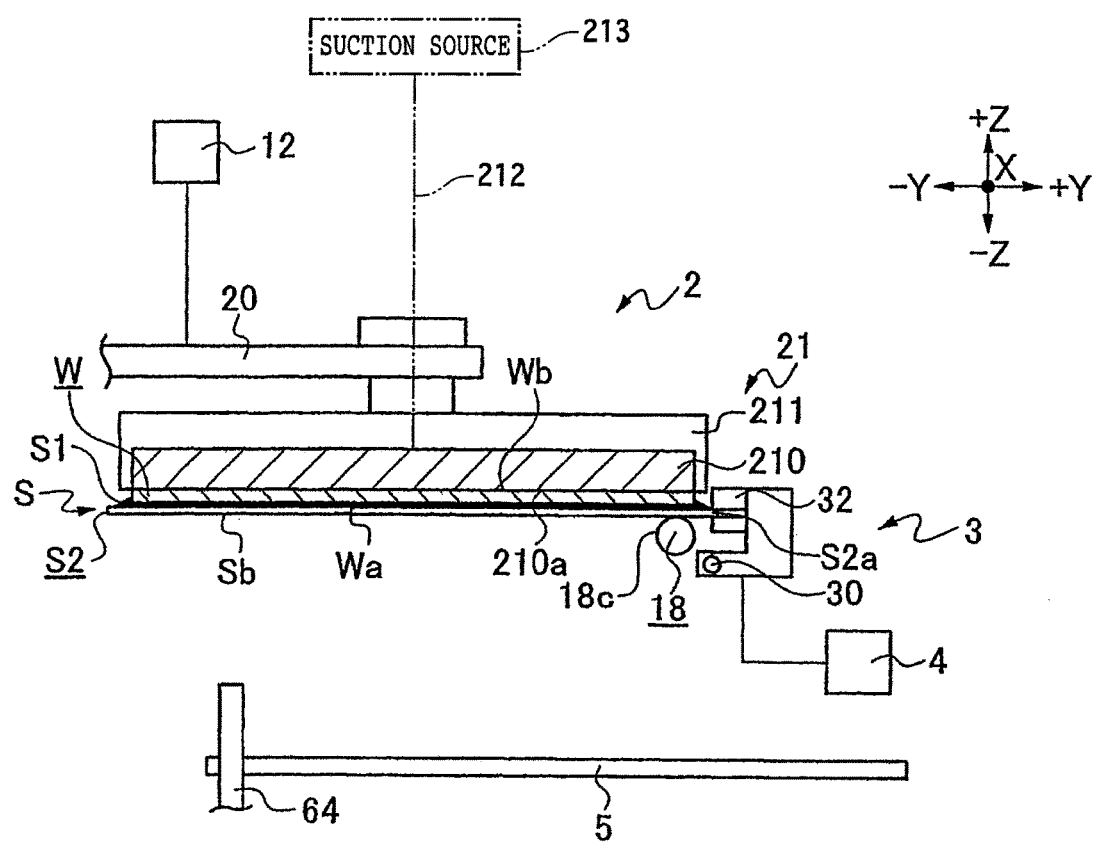
FIG. 2 is a cross-sectional view showing the manner in which a protrusive marginal side of a protective member on a wafer held by holding means is gripped by gripping means.

A peeling apparatus 1 shown in FIG. 1 serves as an apparatus for peeling a protective member S off a wafer W. The protective member S is larger in diameter than the wafer W and fixed to a surface Wa of the wafer W, as shown in FIG. 2. The protective member S has a protrusive marginal side S2a extending radially outwardly beyond an outer circumferential edge Wd of the wafer W. The peeling apparatus 1 includes a base 10 and an upstanding column 11 mounted on a rear portion in a −X direction of the base 10. On an upper portion of a side surface in a +X direction of the column 11, there is disposed Y-direction moving means 12 for moving holding means 2 on a movable plate 121 reciprocally in Y directions by rotating a ball screw 120 about its own axis with a motor 122.

Z-direction moving means 13 for moving the holding means 2 reciprocally in Z directions is disposed on the movable plate 121. The Z-direction moving means 13 moves the holding means 2 reciprocally in the Z directions by rotating a ball screw 130 about its own axis with a motor 132.

The holding means 2 includes an arm 20 having an end in the −X direction fixed to the movable plate 131 and a holding pad 21 for holding the wafer W under suction, the holding pad 21 being disposed on the lower surface of another end in the +X direction of the arm 20. As shown in FIG. 2, the holding pad 21 includes a suction attracting member 210 made of a porous material for attracting the wafer W under suction and a frame 211 supporting the suction attracting member 210 thereon. The suction attracting member 210 is held in fluid communication with a suction source 213 through a suction tube 212. When the suction source 213 is actuated, it produces suction forces by drawing in air, and the suction forces are transmitted through the suction tube 212 to a holding surface 210a provided as an exposed surface of the suction attracting unit 210 and lying flush with the lower surface of the frame 211, whereupon the holding means 2 holds the wafer W under suction on the holding surface 210a.

On an intermediate area of the side surface in the +X direction of the column 11 shown in FIG. 1, i.e., below the path along which the holding means 2 is movable, there are disposed, successively juxtaposed in the +Z direction, a rotational roller 18 having a central axis extending in the X directions, peeling means 4 for peeling the protective member S off the wafer W, imaging means moving means 81 for moving imaging means 80 which images the surface Wa of the wafer W, a placement table 5 for placing thereon the protective member S peeled off the wafer W, and dropping means 6 for dropping the protective member S from the placement table 5. In the vicinity of the peeling means 4 in the +Y direction, a table holding ledge 140 is fixed to the side surface in the +X direction of the column 11. The table holding ledge 140 supports thereon a transfer table 141 for placing thereon the wafer W after it has been ground. The transfer table 141 holds the wafer W under suction on a holding surface 141a thereof.

The peeling means 4 includes a ball screw 40 having a central axis extending in the Y directions, a pair of guide rails 41 disposed parallel to the ball screw 40, a motor 42 for rotating the ball screw 40 about its own axis, and a movable block 43 having an internal nut threaded over the ball screw 40 and a pair of side portions held in sliding contact with the guide rails 41. When the motor 42 is energized to rotate the ball screw 40 about its own axis, the movable block 43 moves in one of the Y directions while being guided by the guide rails 41, causing gripping means 3 disposed on the movable block 43 to move in the same direction.

The gripping means 3 includes a spindle 30 having a central axis extending in the X directions, a housing 31 by which the spindle 30 is rotatably supported, and a gripping clamp 32 disposed on the distal end in the +X direction of the spindle 30. The gripping clamp 32 includes a pair of hinged gripper plates 320 movable toward and away from each other for gripping a workpiece therebetween. When the spindle 30 turns about its own axis, the angle at which the gripping clamp 32 grips the workpiece is changed. The gripping means 3 may be vertically movable on the movable block 43.

The rotational roller 18 is of a cylindrical outer shape, and is rotatable about its X-direction axis by a motor, not shown. The rotational roller 18 abuts against the protective member S to prevent the resin S1 shown in FIG. 2 from being folded when the protective member S is peeled off the wafer W. The rotational roller 18 may be movable in the Y directions.

The imaging means moving means 81 includes a ball screw 810 having a central axis extending in the Y directions, the guide rails 41 disposed parallel to the ball screw 810, a motor 812 for rotating the ball screw 810 about its own axis, and a movable block 813 having an internal nut threaded over the ball screw 310 and a pair of side portions held in sliding contact with the guide rails 41. When the motor 812 is energized to rotate the ball screw 810 about its own axis, the movable block 813 moves in one of the Y directions while being guided by the guide rails 41, causing the imaging means 80 disposed on the movable block 813 to move in the same direction.

The imaging means 80 disposed on the movable block 813 includes a line sensor in the form of a charge-coupled device (CCD) sensor or the like, for example. The imaging means 80 has a length in the X directions which is equal to or greater than the diameter of the holding pad 21 of the holding means 2, so that the imaging means 80 has a measuring field of vision longer than the diameter of the wafer W. The imaging means 80 has an image capturing unit 800 including an array of image detectors arranged along the X directions, and is disposed on the movable block 813 such that the image capturing unit 800 faces upwardly. The imaging means 80 can image the surface Wa of the wafer W which is held by the holding means 2 and positioned above the imaging means 80. Decision means 19 including a central processing unit (CPU), a memory element, etc. is electrically connected to the imaging means 80.

The placement table 5 is of a substantially rectangular outer shape, for example, and has a duck-board-like placement surface 5a. Specifically, the placement table 5 includes a plurality of parallel straight slats 50 extending longitudinally in the Y directions and spaced at equal intervals in the X directions. The slats 50 are securely joined together by a bar-like joint, not shown, on their ends in the +Y direction. The placement table 5 is fixed to the side surface in the +X direction of the column 11, by the bar-like joint that joins the slats 50. Alternatively, the placement table 5 has a lower surface 5b partly fixed to side surfaces 61c of a pair of guide rails 61 of the dropping means 6 to be described later. Thus, the placement table 5 is disposed below the path along which the gripping means 3 and the holding means 2 are movable.

The dropping means 6 includes a ball screw 60 having a central axis extending in the Y directions, a pair of guide rails 61 disposed parallel to the ball screw 60, a motor 62 for rotating the ball screw 60 about its own axis, a movable block 63 having an internal nut threaded over the ball screw 60 and a side portion 630 held in sliding contact with the guide rails 61, and a pair of ejector pins 64 disposed on the movable block 63.

The movable block 63 has a side portion 630 threaded over the ball screw 60 and a pin support 631 projecting from an upper end of the side portion 630 in the +X direction. The two ejector pins 64 that project in the +Z direction are disposed on an upper surface of the pin support 631. The ejector pins 64 are spaced a predetermined distance from each other in the X directions. When the motor 62 is energized to rotate the ball screw 60 about its own axis, the movable block 63 moves in one of the Y directions while being guided by the guide rails 61, causing the ejector pins 64 disposed on the movable block 63 to move in the same direction through the gaps between slats 50 of the placement table 5.

A box 7 for storing therein the protective member S peeled off the wafer W is mounted on the base 10. The box 7 is of an outer shape as a substantially rectangular parallelepiped, for example, and is upwardly open below a side end in the +Y direction of the placement table 5. The box 7 supports on its upper end a transmissive optical sensor 79 that includes a light emitter 790 offset in the −Y direction and a light detector 791 offset in the +Y direction. Protective members S that are successively peeled off wafers W are placed one by one on the placement table 5 and then dropped from the placement table 5 into the box 7 by the dropping means 6. When the protective members S stack in the box 7 up to a certain height, the uppermost one of the protective members S interrupts an inspection beam of light emitted from the light emitter 790 toward the light detector 791, enabling the optical sensor 79 to detect that the box 7 has been filled with the protective members S.

Operation of the peeling apparatus 1 for peeling the protective member S from the wafer W will be described below with reference to FIGS. 1 through 5. In FIGS. 2 through 5, the peeling apparatus 1 is illustrated as simplified.

As shown in FIG. 1, the wafer W which has been ground is placed on the transfer table 141 with the ground surface Wb facing upwardly. The holding means 2 moves in the +Y direction to a position above the wafer W until the center of the holding surface 210a of the holding pad 21 is substantially aligned with the center of the surface Wb of the wafer W. The holding means 2 is lowered in the −Z direction until the holding surface 210a of the holding pad 21 is brought into contact with the surface Wb of the wafer W. The suction source 213 is actuated, producing suction forces that are transmitted to the holding surface 210a, whereupon the holding means 2 holds the surface Wb of the wafer W under suction with the protective member S disposed therebelow.

As shown in FIG. 2, the holding means 2 that is holding the wafer W under suction moves in the −Y direction to a position above the rotational roller 18, and then descends to bring a side surface 18c of the rotational roller 18 into abutment against a lower surface Sb of the protective member S near an outer circumferential portion thereof in the +Y direction. The peeling means 4 moves the gripping means 3 in the −Y direction to position the gripping clamp 32 and the protrusive marginal side S2a of the protective member S in alignment with each other. The gripping clamp 32 then grips the protrusive marginal side S2a of the protective member S. The protective member S includes a resin S1 and a film S2, the film S2 being secured to the surface Wa of the wafer W with the resin S1 interposed therebetween.

Figure 3:
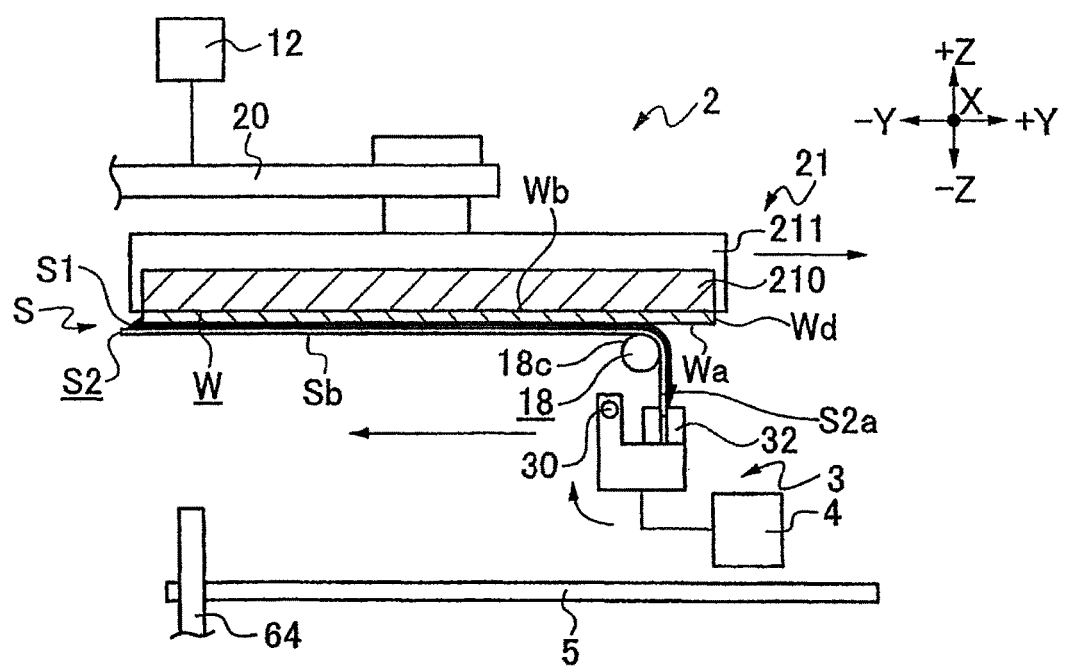
FIG. 3 is a cross-sectional view showing the manner in which the gripping means that is gripping the protrusive marginal side of the protective member is moved by peeling means, and the holding means is moved in an opposite direction to the peeling means, starting to peel the protective member off the wafer.

As shown in FIG. 3, after the gripping clamp 32 has gripped the protrusive marginal side S2a of the protective member S, the spindle 30 turns clockwise through 90 degrees about its own axis as seen from the +X direction. While the rotational roller 18 is supporting the lower surface Sb of the protective member S, the resin S1 of the protective member S is gradually bent along the side surface 18c of the rotational roller 18, and the protective member S is pulled in the −Z direction by the gripping clamp 32, so that part of the protective member S is peeled off the surface Wa of the wafer W.

Then, the peeling means 4 relatively moves the gripping means 3 and the holding means 2 radially inwardly from the outer circumferential edge Wd of the wafer W toward the center thereof, peeling the protective member S off the wafer W. Specifically, the peeling means 4 moves the gripping means 3 in the −Y direction, and the Y-direction moving means 12, for example, moves the holding means 2 in the +Y direction. The rotational roller 18 rotates about its own axis along the X directions, and while the resin S1 of the protective member S keeps itself gradually bent along the side surface 18c of the rotational roller 18, the protective member S is peeled off the wafer W in the −Y direction from the outer circumferential edge Wd in the +Y direction of the wafer W. If the resin S1 is folded when the protective member S is being peeled off, then residues of the resin S1 may remain on the wafer W, and the surface Wa of the wafer W may be damaged by impact forces applied instantaneously from the resin S1 to the surface Wa of the wafer W as a reaction to the folding of the resin S1. However, since the side surface 18c of the rotational roller 18 is held in abutment against the film S2, the wafer W is prevented from suffering those problems.

Figure 4:
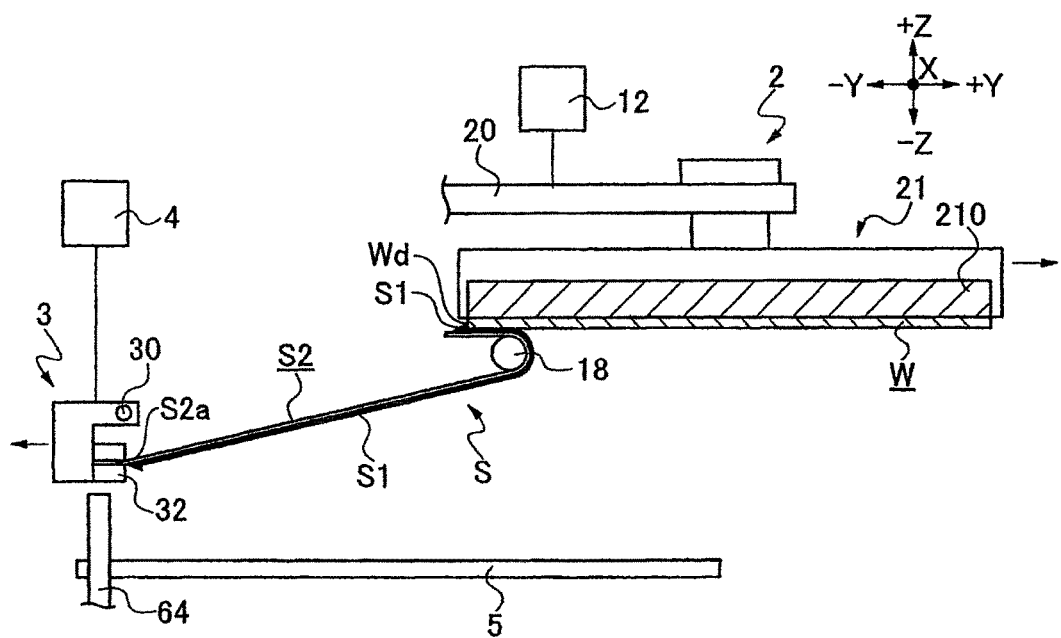
FIG. 4 is a cross-sectional view showing the manner in which the gripping means that is gripping the protrusive marginal side of the protective member is moved by peeling means, and the holding means is moved in the opposite direction to the peeling means, peeling most of the protective member off the wafer.

As shown in FIG. 4, when the gripping means 3 moves to a position in the vicinity of the outer circumferential edge Wd in the −Y direction of the wafer W, the spindle 30 turns further clockwise through 90 degrees about its own axis as seen from the +X direction, directing the resin S1 of the protective member S downwardly. The Y-direction moving means 12 moves the holding means 2 in the +Y direction, and the peeling means 4 moves the gripping means 3 in the −Y direction, fully peeling the protective member S off the wafer W. When the protective member S has been completely peeled off the wafer W, the gripping clamp 32 is opened to release the protrusive marginal side S2a of the protective member S from the gripping means 3, letting the protective member S drop onto the placement table 5 with the resin S1 facing downwardly.

Figure 5:
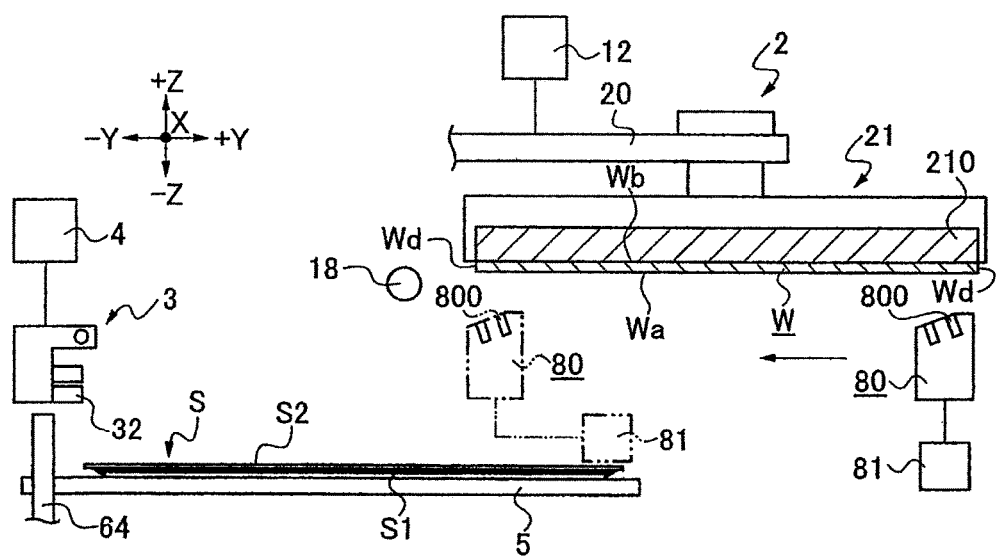
FIG. 5 is a cross-sectional view showing the manner in which the surface of the wafer on which the protective member was formed is imaged by imaging means.
Figure 6:
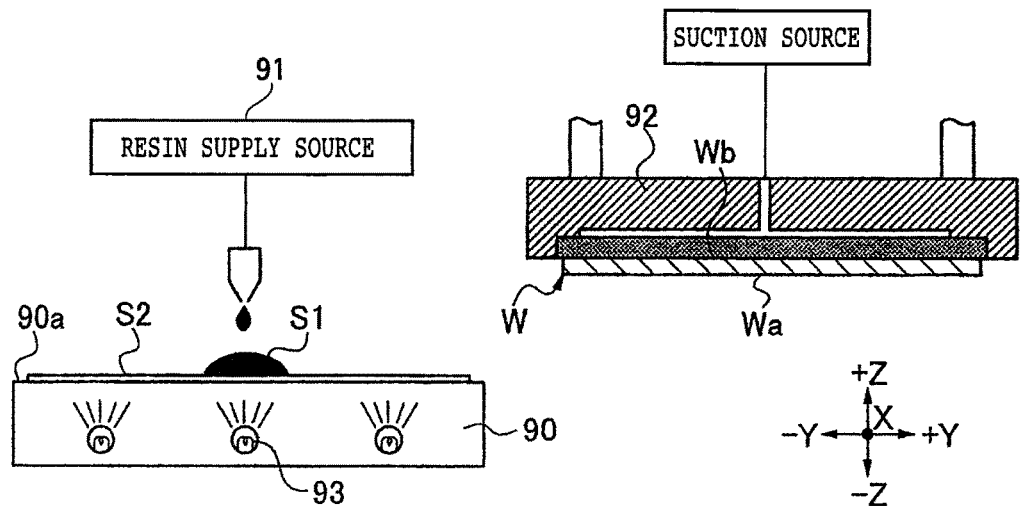
FIG. 6 is a side elevational view, partly in cross section, schematically showing the manner in which a protective member of a liquid resin is formed on a surface of a wafer.
Figure 7:
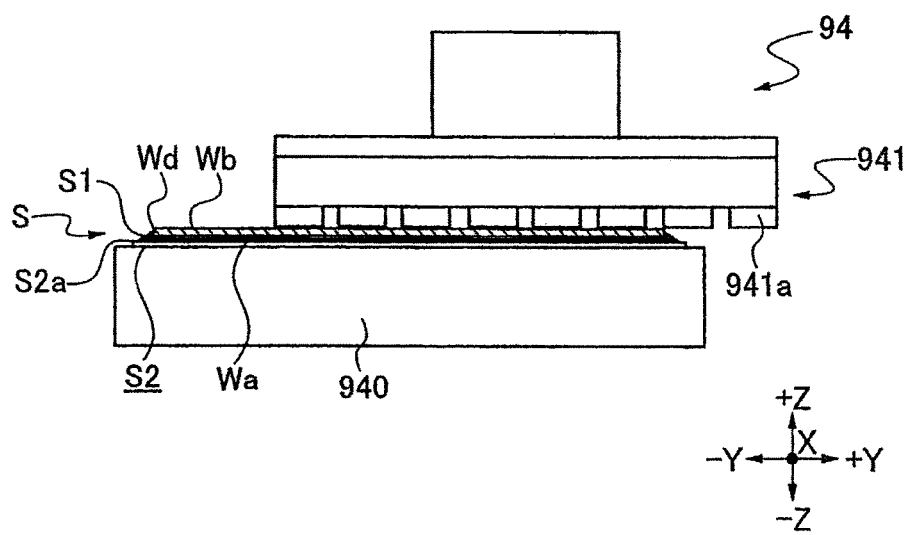
FIG. 7 is a side elevational view showing the manner in which the protective member is held and the other surface of the wafer is ground.

Then, the peeling means 4 stops moving the gripping means 3, and the Y-direction moving means 12 stops moving the holding means 2. As shown in FIG. 5, the imaging means moving means 81 moves the imaging means 80 in the −Y direction, causing the imaging means 80 to pass below the wafer W held by the holding means 2. During passage of the imaging means 80 below the wafer W, the image capturing unit 800 of the imaging means 80 continuously images the surface Wa of the wafer W from the outer circumferential edge Wd in the +Y direction of the wafer W to the outer circumferential edge Wd in the −Y direction of the wafer W, capturing an image of the entire surface Wa of the wafer W.

The imaging means 80 sends data of the captured image to the decision means 19 shown in FIG. 1. If the resin S1 is represented as pixels having inherent color information in the captured image, then the decision means 19 decides that residues of the resin S1 of the projective member S remain on the surface Wa of the wafer W from which the protective member S has been peeled off.

The peeling apparatus 1 according to the present invention basically operates as follows: The peeling means 4 relatively moves the gripping means 3 and the holding means 2 radially inwardly from the outer circumferential edge Wd of the wafer W toward the center thereof, peeling the protective member S off the wafer W. Thereafter, the imaging means 80 captures an image of the surface Wa of the wafer W on which the protective member S was formed, and the decision means 19 decides whether residues of the resin S1 remain on the surface Wa of the wafer W or not from the captured image.

If the decision means 19 decides that residues of the resin S1 remain on the surface Wa of the wafer W from which the protective member S has been peeled off, then the wafer W with the residues of the resin S1 is not stored in a wafer storage cassette, but is separated from other normal wafers W. The operator then scrapes the residues of the resin S1 off the surface Wa of the wafer W, or sends the wafer W with the residues of the resin S1 again to a protective member forming apparatus or the like where a protective member S will be formed once more on the surface Wa of the wafer W. The newly formed protective member S is peeled off the wafer W again by the peeling apparatus 1, thereby removing the residues of the resin S1 from the wafer W. Consequently, only those wafers which are free of residues of the resin S1 are supplied to and ground by a grinding apparatus, so that wafers which have thickness irregularities and hence which are not flat are prevented from being manufactured.

The peeling apparatus 1 is not limited to the above embodiment, and the sizes, shapes, and other details of the peeling apparatus 1 shown in the accompanying drawings are not limited to those illustrated, but may be changed or modified within the scope of the invention. For example, inasmuch as the peeling means 4 may relatively move the holding means 2 and the gripping means 3 radially inwardly from the outer circumferential edge Wd of the wafer W toward the center thereof, peeling the protective member S off the wafer W, the gripping means 3 may not move in the Y directions, but only the holding means 2 move in the Y directions to peel the protective member S off the wafer W. The imaging means 80 may not move in the Y directions, but only the holding means 2 may move in the Y directions, allowing the imaging means 80 to capture an image of the surface Wa of the wafer W from which the protective member S has been peeled off. The image means 80 is not limited to a line sensor, but may be an area sensor or the like.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A peeling apparatus for peeling a protective member off a wafer, the protective member including a resin and a film which is fixed to one surface of the wafer with the resin interposed therebetween, the film having a protrusive marginal side extending radially outwardly beyond an outer circumferential edge of the wafer, comprising:

holding means having a holding surface for holding another surface of the wafer thereon with the protective member disposed below the another surface;

gripping means for gripping the protrusive marginal side of the protective member on the wafer held by the holding means;

peeling means for peeling the protective member off the wafer by relatively moving the gripping means and the holding means radially inwardly from the outer circumferential edge of the wafer toward the center of the wafer;

imaging means for capturing an image of the one surface of the wafer on which the protective member was formed after the protective member has been peeled off the wafer by the peeling means; and decision means for determining whether residues of the resin remains on the wafer or not from the image captured by the imaging means.

* * * * *